(12) United States Patent
Thallner

(10) Patent No.: US 8,142,701 B2
(45) Date of Patent: Mar. 27, 2012

(54) METHOD AND DEVICE FOR PRODUCING A NANOPATTERNED DISC

(76) Inventor: Erich Thallner, St. Florian (AT)

(*) Notice: Subject to any disclaimer, the term of this patent is extended or adjusted under 35 U.S.C. 154(b) by 800 days.

(21) Appl. No.: 12/051,878

(22) Filed: Mar. 20, 2008

(65) Prior Publication Data
US 2008/0233331 A1 Sep. 25, 2008

(30) Foreign Application Priority Data
Mar. 21, 2007 (EP) .................................... 07005791

(51) Int. Cl.
*B29C 59/00* (2006.01)
*B29C 37/00* (2006.01)
*B29D 17/00* (2006.01)
(52) U.S. Cl. ........ 264/293; 264/1.33; 425/385; 425/150
(58) Field of Classification Search .................. 425/385, 425/150, 810; 264/1.33, 293
See application file for complete search history.

(56) References Cited

U.S. PATENT DOCUMENTS

| | | | |
|---|---|---|---|
| 5,512,131 A * | 4/1996 | Kumar et al. .................. | 438/738 |
| 6,757,116 B1 | 6/2004 | Curtiss et al. .................... | 360/15 |
| 6,814,898 B1 | 11/2004 | Deeman et al. ............. | 264/1.33 |
| 6,869,557 B1 | 3/2005 | Wago et al. .................... | 264/293 |
| 6,949,199 B1 | 9/2005 | Gauzner et al. .................. | 216/2 |
| 7,074,341 B1 | 7/2006 | Kurataka et al. ............... | 216/22 |
| 2003/0178316 A1 | 9/2003 | Jacobs et al. .................. | 205/157 |
| 2004/0101713 A1 | 5/2004 | Wachenschwanz et al. .. | 428/694 |
| 2004/0132301 A1 | 7/2004 | Harper et al. ................. | 438/689 |
| 2004/0149367 A1 | 8/2004 | Olsson et al. ................... | 156/64 |
| 2004/0229140 A1 | 11/2004 | Kim ................................. | 430/7 |
| 2005/0048154 A1 * | 3/2005 | Umada et al. .............. | 425/174.4 |
| 2005/0133954 A1 | 6/2005 | Homola ........................ | 264/219 |
| 2005/0146078 A1 * | 7/2005 | Chou et al. .................... | 264/293 |
| 2006/0006580 A1 * | 1/2006 | Olsson et al. .................. | 264/293 |

FOREIGN PATENT DOCUMENTS

| | | |
|---|---|---|
| EP | 1 669 196 A1 | 6/2006 |
| JP | 2001-209978 | 8/2001 |
| JP | 2005-178384 | 7/2005 |
| JP | 2005-183985 | 7/2005 |
| JP | 2005-537656 | 12/2005 |
| JP | 2005-539396 | 12/2005 |
| SE | 522237 | 1/2004 |
| WO | WO 03/065120 A2 | 8/2003 |
| WO | WO2004/021083 | 3/2004 |
| WO | WO2004/027460 | 4/2004 |
| WO | WO 2006/006854 A2 | 1/2006 |
| WO | WO 2007/067488 A2 | 6/2007 |

OTHER PUBLICATIONS

Wu Wei et al., "*Large Area High Density Quantized Magnetic Disks Fabricated Using Nanoimprint Lithography*," J. Vac. Sci. Technol., Nov./Dec. 1998, American Vacuum Society, pp. 3825-3829. R. Islam et al., "*One Micron Precision Optically Aligned Method for Hot-Embossing and Nanoimprinting*," © 2002 IEEE, pp. 931-935.
Thomas Glinsner et al., "*Nanoimprint Lithography Enables Patterned Tracks for High-Capacity Hard Disks*," (Document XP-001227287), Solid State Technology, Mar. 2005, pp. 51-54.
Notice of Reasons for Rejection for related JP2008-072451 (including English translation), mailed Jul. 26, 2011.

* cited by examiner

*Primary Examiner* — Maria Veronica Ewald
(74) *Attorney, Agent, or Firm* — Kusner & Jaffe

(57) ABSTRACT

The invention relates to a method and a device according to the preambles of claims 1 and 10, and also to the use of a nanopatterned die, a disc with a defined nanopattern and a hard disk drive comprising a disc of this type. In order to propose a more rapidly operating device as well as a corresponding method in which the smallest-possible patterns can be applied to discs, and in order to provide discs, which are produced as cost-effectively as possible, for hard disk drives, said discs having smaller patterns and thus being able to be produced rapidly and cost-effectively, the invention proposes using microcontact printing (μCP) in the production of micropatterned and/or nanopatterned products/substrates of this type.

6 Claims, 2 Drawing Sheets

METHOD AND DEVICE FOR PRODUCING A NANOPATTERNED DISC

FIELD OF THE INVENTION

The invention relates to a method and a device according to the preambles of claims 1 and 10 and also to the use of a nanopatterned die, a disc with a defined nanopattern and a hard disk drive with a disc of this type.

BACKGROUND OF THE INVENTION

Known hard disk drives consist of one or more discs which are provided with magnetizable material in an annular pattern on one or both flat sides of the discs. Hard disk drives comprise at least one read/write unit in order to read-out the magnetized pattern. At present unpatterned discs are used exclusively.

Due to the increasing demand for ever greater bit density, it is desirable to reduce the dimensions of the magnetizable layer applied to the discs.

Magnetizable patterns for patterned discs (known as "patterned media") may theoretically also be produced by stamping methods, in which, for example, a robotic arm, generally centrally gripping the centre hole of a disc, places said disc on a die and the die located above is guided, after adjustment, onto the disc below, the disc being stamped by application of considerable mechanical pressure of from 10 N/cm$^2$ to 100 kN/cm$^2$ to the polymer material to be stamped of the discs.

When using quartz dies considerable stamping forces are also required, as is a considerable curing time for the material, which considerably restricts throughput when producing the discs and thus causes production costs as well as the production speed to increase considerably.

Further drawbacks of the methods described are the adjustment accuracy of the dies due to the elevated forces to be applied to the disc, as well as problems caused by soiling of the die.

In storage discs of this type, it is also important that the concentric patterns are aligned with a high degree of accuracy exactly with the rotational axis of the storage discs. A non-centered transfer would make it impossible to guide the read head of a hard disk drive, since it is conventional for the rotational speed to be greater than 7,000 revolutions per minute.

In storage discs which are patterned on both sides, it is necessary for the patterns on the second side to correspond as exactly as possible to the patterns on the first side.

SUMMARY OF THE INVENTION

The object of the invention is therefore to propose a more rapidly-operating device and a corresponding method in which patterns, which are as small as possible, are applied to discs.

An additional object is to provide discs, which are produced as cost-effectively as possible, for hard disk drives, said discs having smaller patterns and thus being able to be produced rapidly and cost-effectively.

In terms of the device, the object is achieved with the features of claim 1, in terms of the method, the object is achieved with the features of claim 10 and in terms of the disc to be proposed, the object is achieved with the features of claim 14.

The basic principle behind the present invention is the use of microcontact printing (μCP) in the production of micropatterned and/or nanopatterned products/substrates of this type. This requires a lithography step, in contrast to the methods known in the art.

An advantage of printing is that the patterns can be transferred very quickly and hardly any or very slight compressive forces have to be exerted on the discs. The compressive force required is between 0.05 and 5 N/cm$^2$, preferably between 0.05 and 2 N/cm$^2$, so the force applied with the die weight is sometimes sufficient. The obtainable throughput is similarly considerably improved when producing the discs.

Due to the lower compressive forces which have to be transferred by the device, it is possible to achieve the required accuracy in terms of the position of the dies relative to one another and the position of the dies relative to the discs to be stamped, even for markedly smaller and tighter patterns.

Particular accuracy can be achieved as a result of the fact that the die is formed from a rigid substrate and the die pattern is connected as directly as possible to the rigid substrate in order to avoid, to the greatest possible extent, interaction between adjacent raised patterns of the die. Attention must thus be paid to achieving the closest-possible connection between the die pattern and the substrate of the die. This avoids, to the greatest possible extent, horizontally acting forces during stamping and consequent shifts in the die pattern in such a way that it is possible to reproduce the die pattern very precisely. The adjustment accuracy in this case is less than 20 μm.

A particularly close connection can be achieved by porous substrate material, in particular ceramic, the die material being drawn through the substrate with only the die pattern projecting from the substrate.

The invention, in its most general embodiment, comprises at least one nanopatterned die, preferably a polydimethylsiloxane (PDMS) die, for transferring a defined nanopattern of the nanopatterned die onto the upper side of the disc and/or the lower side of the disc.

The method, in its most general embodiment, comprises the following method steps:

a) placing a disc on a receiving unit of a device for producing a nanopatterned disc, b) accurately aligning the disc relative to at least one die, preferably a polydimethylsiloxane (PDMS) die, and c) transferring a defined nanopattern of the nanopatterned die onto the lower side of the disc and/or the upper side of the disc.

Due to the fact that the device comprises two opposingly aligned nanopatterned dies and that the disc can be arranged so as to be aligned between the dies, the disc can advantageously simultaneously be provided with a pattern on both sides. This measure also means that only a single compressive force must be applied to pattern both sides of the disc. This firstly results in energy being saved, and secondly, doubles the operational speed during production or doubles the storage capacity of the disc.

In an advantageous embodiment, it is provided that the device comprises at least one die receiving unit associated with each die. The die can thus be removed or exchanged, depending on the application. Each die receiving unit is associated with a positioning unit, with which the die receiving unit, together with the die fitted on the die receiving unit, can be moved to any desired position parallel to the disc. It is particularly advantageous to divide the positioning unit into one unit for each movement direction—the x-, y- and z-directions, the x- and y-direction forming a plane parallel to the disc 7 and the z-direction extending orthogonally to the disc.

This measure increases the required positioning/adjustment/aligning accuracy of the respective die relative to the disc, to a maximum deviation of +/−5 µm and less.

In the case of a plurality of dies, additional positioning units, which align the dies relative to one another, are provided in order to align the patterns arranged opposingly on the disc as precisely as possible with one another, overlapping of the individual corresponding patterns, such as recesses, being adjustable, with alignment of at least 30%, preferably, however, of greater than 70%. In the present method, the opposing patterns deviate from one another by less than 20 µm, preferably less than 5 µm.

The dies may advantageously be fixed to the die receiving unit by die holders, fixing being achieved in particular by applying a vacuum to vacuum grooves arranged between the die receiving unit and the die holder. Positioning can be particularly advantageously achieved due to the fact that the positioning units comprise a separate disc positioning unit for the x-direction, y-direction and z-direction for precisely positioning the disc relative to the die associated with the lower side of the disc, and a separate die positioning unit for the x-direction, y-direction and z-direction for precisely positioning the die associated with the upper side of the disc relative to the die aligned with the disc.

Due to the fact that positioning/alignment of the disc and the dies relative to one another is controlled by a central control unit, which is connected by control lines to the positioning units and the, preferably optical, detection means, all of the parameters and prerequisites required for the method can be collectively evaluated and, if necessary, can be reacted upon in a correspondingly centrally-controlled manner.

The position of the disc is to be detected as accurately as possible, at least three, preferably four detection units, which are at a defined radial distance from a predetermined disc receiving position, being provided for detecting the precise position of the disc in the x-direction and the y-direction as disc position information. The disc receiving position is the position in which the disc is placed on the receiving device, for example by a robotic arm. The disc position information can be retrieved by the central control unit via a line in order that the disc is aligned as accurately as possible relative to the two dies or, conversely, the die is aligned as accurately as possible relative to the disc.

Due to the fact that the disc can be received in a precisely centered manner on a receiving unit and that the receiving unit is arranged between the disc and disc positioning units, the concentric patterns may be transferred in a centered manner with a high degree of accuracy relative to the centre hole or the subsequent axis of rotation of the disc.

It is possible to position the upper die precisely relative to the lower die which was previously aligned with the disc due to the fact that the receiving unit comprises markings which can be associated with the exact centre of the disc, and that a detection unit which is fitted to the die receiving unit of the upper die detects the misalignment and/or the spacing of the upper die from the disc as die position information, the die position information being retrievable by the control unit via a line.

Due to said die position information and the known positions of the disc and the lower die (disc position information) the upper die can be very precisely positioned or aligned above the disc and also aligned relative to the disc and the die, said process being controlled by the central control unit and taking place in such a way that firstly the die patterns are arranged/aligned with one another in the most precise manner on the upper and lower sides of the disc, and secondly, the concentric patterns are aligned precisely relative to the subsequent rotational axis of the disc.

In the method according to the invention, the disc is initially placed on the receiving unit by a robot or robotic arm, the disc, after being placed on the receiving unit, preferably being at a very small distance of some micrometers to the die. The disc is preferably received on the receiving unit so as to be already aligned parallel to the die. After the disc is placed, the position of the disc relative to the lower die is detected by lateral detection means, retrieved by the central control unit, converted if necessary, and the disc is subsequently precisely centrally aligned above the die by the positioning units which move the receiving unit. At the same time as or directly after the alignment of the disc relative to the lower die, the upper die is aligned relative to the lower die by upper positioning units in such a way that the corresponding patterns are precisely aligned with one another. The corresponding alignment of the upper and lower dies can first be determined by a test print and can be entered into the central control unit as a parameter (calibration).

After the dies and the disc have been adjusted in the x-direction and in the y-direction, the disc receiving unit is lowered by a positioning unit, which acts in the z-direction, until the disc rests on the lower die therebeneath and the lower side of the disc is in contact with the die. While it is lowered, there may be, if necessary, adjustment in the x-direction and in the y-direction in order to compensate for any changes in the position previously achieved by the disc which may have occurred during the lowering procedure onto the die.

At the same time, or directly thereafter, the upper die is lowered downwards towards the disc by the positioning unit which is associated with the upper die and acts in the z-direction, accurate alignment of the upper die being ensured by constantly measuring the desired position of the upper die relative to the lower die with detection means and correspondingly correcting the position in the x- and y-directions by positioning units, this being controlled by the central computer.

Parameters which may additionally be required, such as the thickness of the disc for example, can be entered manually into the central control unit or can be automatically detected by further detection means.

Advantageous embodiments of the invention are provided in the sub-claims.

BRIEF DESCRIPTION OF THE DRAWINGS

Further advantages and expedient embodiments of the invention are described in the further claims, the figures, the description and the drawings, in which:

DETAILED DESCRIPTION OF PREFERRED EMBODIMENTS

Figure 1:
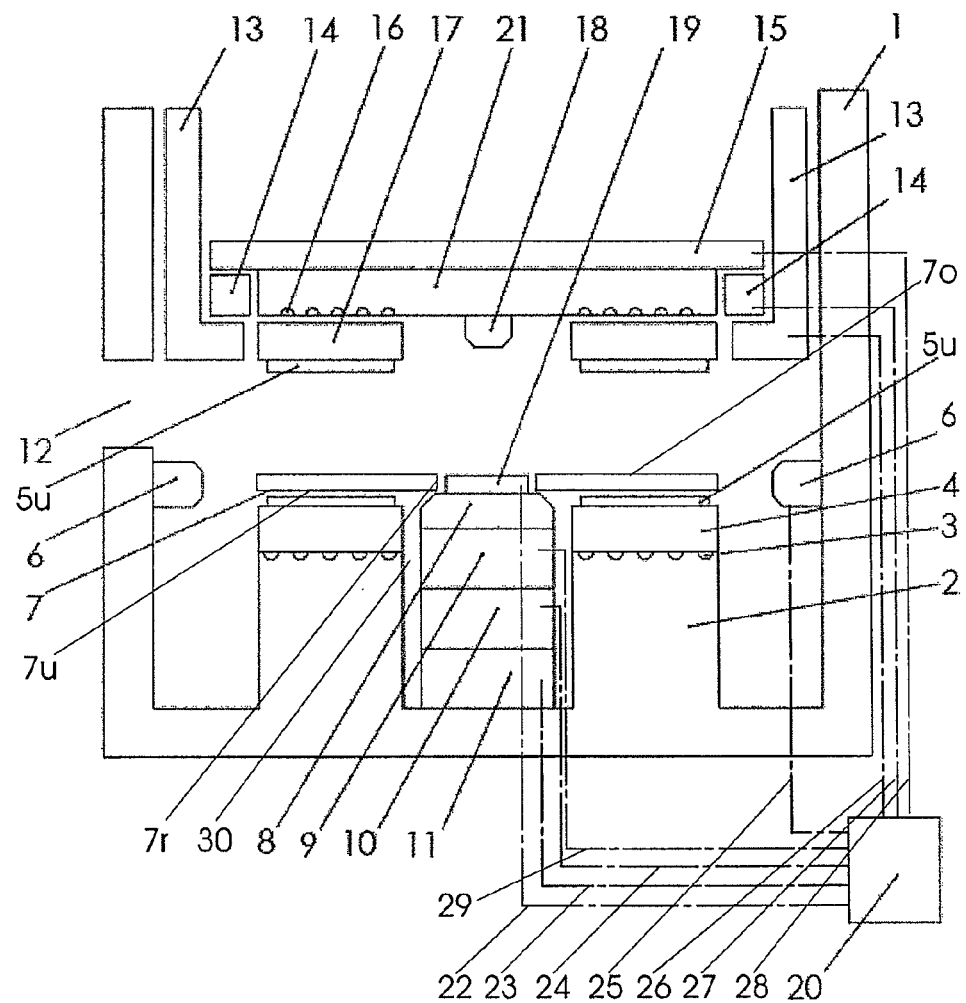
FIG. 1 is a sectional, schematic side view of a device according to the invention.

In the high precision device according to the invention shown in FIG. 1, a housing is denoted with the reference numeral 1 and substantially completely encloses the device. A housing is not necessary. A dimensionally stable connection between the upper and lower die units, for example columns or one-sided support (arms), is instead sufficient. A central control unit 20, which also comprises a data store, a monitor, an entry keyboard and an arithmetic-logic unit, can also be arranged outside the housing 1 and connected to corresponding components of the device via lines 22, 23, 24, 25, 26, 27, 28 and 29.

On the base of the housing, preferably integral with the housing 1, a die receiving unit 2 as an annular moulding is integrally formed or fitted. From the vacuum grooves 3, via a vacuum line (not shown), which is connected to a vacuum system, a vacuum can be applied to the upper flat side of the die receiving unit 2, by means of which vacuum a die holder 4, which rests on the die receiving unit 2 in a planar manner, is held thereon.

A lower PDMS die 5u is attached to the die holder 4, and the surface of the die receiving unit 2 and also the die holder 4 and the lower PDMS die 5u are arranged in a level plane and also a parallel plane.

In the clearance region 30, which is open upwards and is delimited by the annular die receiving unit 2 and the base of the housing 2, disc positioning units 9, 10 and 11 are arranged, which each ensure the positioning of the receiving unit 8, which is arranged on the disc positioning units 9, 10 and 11, for receiving the disc 7. The lowest disc positioning unit 11, controlled by the central control unit 20, can move the receiving unit 8 in the y-direction, i.e. into and out of the patterning plane. The disc positioning unit 10 arranged thereabove enables displacement in the x-direction, i.e. towards the left and the right in the patterning plane. The disc positioning unit 9 arranged above the disc positioning unit 10 enables displacement in the z-direction, i.e. upwards and downwards in the patterning plane. The disc positioning units 9, 10 and 11 may also be arranged above one another in any desired sequence or may be combined in a single unit.

The receiving unit 8 receives the disc 7 in the region of the edge 7r of the centre hole of the disc 7, the disc being received in such a way that the disc 7 is arranged parallel to the surface of the lower PDMS die 5u.

Figure 2:
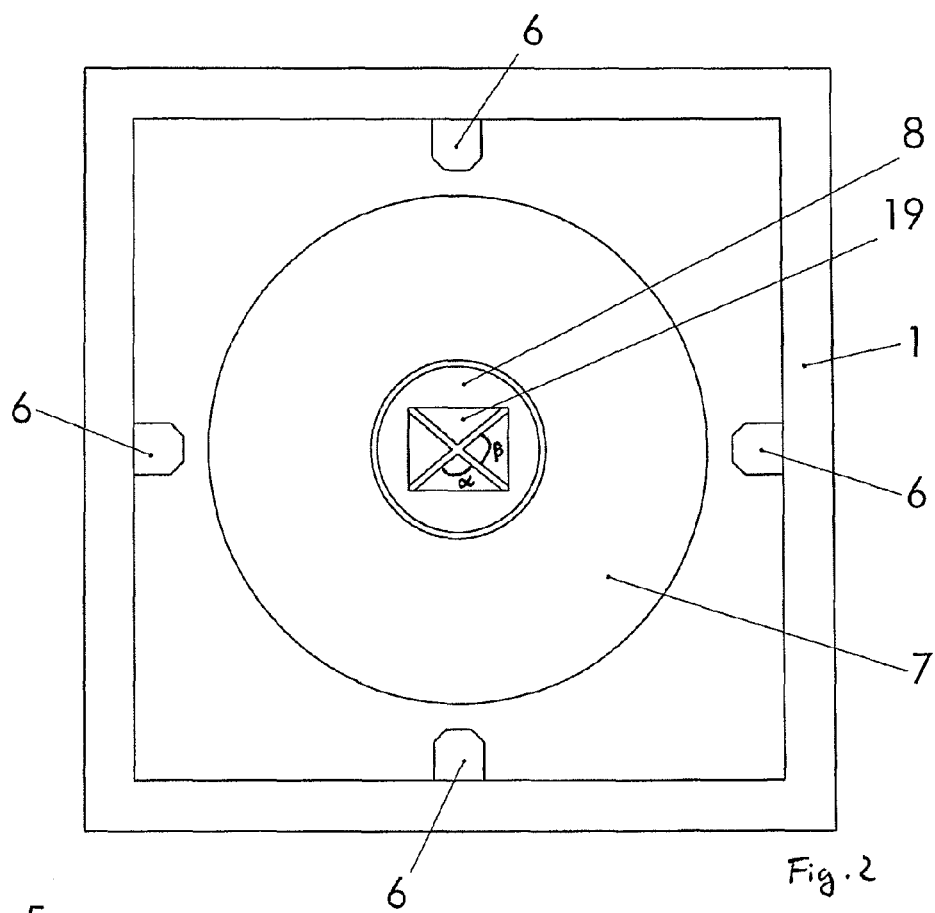
FIG. 2 is a sectional, schematic plan view of the device according to the invention

In the starting position, before the disc 7 is aligned relative to the lower PDMS die 5u, the lower side 7u of the disc 7 is arranged a few micrometers above the surface of the lower PDMS die 5u. In the plane formed by the disc 7, four detection units 6 (see also FIG. 2) are located at a lateral distance from the disc 7 and are distributed over the periphery. The detection units 6 measure the distance to the periphery of the disc 7, information on the disc position being able to be calculated from the distance and the disc position information being retrievable by the central control unit 20 via a line 25 or via a plurality of lines 25 to the four detection units 6. Calculating the disc position information is preferably carried out in the central control unit 20. The position of the PDMS die 5u is predetermined or is also detected by detection means.

The disc 7 is placed on the receiving unit 8 by a robotic arm (not shown) via a lateral housing opening 12. The housing opening 12 can be formed so as to be closable.

Figure 3:
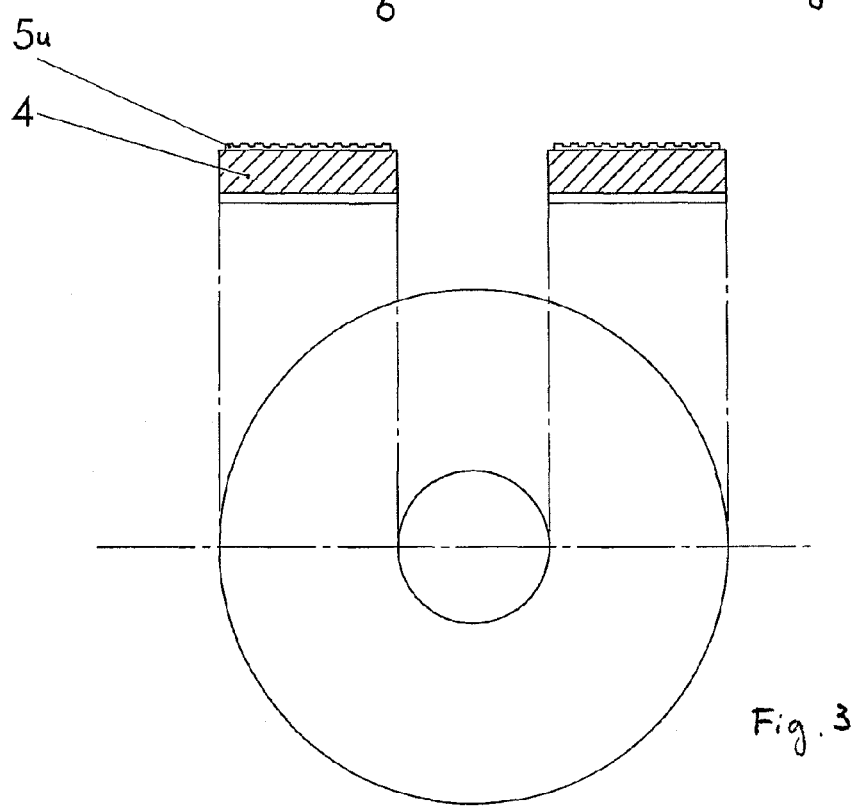
FIG. 3 shows a die according to the invention with the die holder in a plan view and a sectional side view.

An upper PDMS die 5o, which is arranged in a mirror-image to the lower PDMS die 5u, is fitted above the disc 7 on a disc holder 17, the unit composed of the upper PDMS die 5o and the die holder 17 substantially corresponding to the module composed of the die holder 4 and the lower PDMS die 5u shown in FIG. 3.

The upper PDMS die 5o is fixed to a die receiving unit 21 by vacuum grooves 16, in a manner analogous to the lower PDMS die 5u. The die receiving unit 21 can be displaced almost at will parallel to the disc 7 by separate die positioning units 13, 14 and 15—it can be displaced in the x-direction by the die positioning unit 14, in the y-direction by the die positioning unit 15 and in the z-direction by the die positioning unit 13 which is preferably guided on the inner wall of the housing 1.

The die position information for the upper PDMS die 5o relative to the lower PDMS die 5u is detected by an optical detection unit 18, which is fitted centrally on the die receiving unit 21 and is connected to the central control unit 20 via lines (not shown) and said die position information is transmitted to the central control unit 20 or is retrieved thereby.

The position is detected in the x- and y-directions by markings 19 applied on the opposingly arranged receiving unit 8. The markings 19 are optically configured in such a way that conclusions can be made regarding the lateral displacement in the x- and y-directions, in particular by way of two intersecting lines or recesses, the angle of intersection of the two lines/recesses α and β not being equal (see FIG. 2).

Conversely, a position sensor may be provided instead of the markings 19, for example a position sensitive device (PSD) or a four-quadrant sensor. A laser, which is detected by the position sensor, would then be fitted instead of the optical detection unit 18.

In FIG. 1, the central control unit is connected to the markings 19 via the line 22, to the disc positioning units 11, 10 and 9 via the lines 23, 24 and 29 and to the die positioning units 13, 14 and 15 via the lines 26, 27 and 28.

The finished micropatterned and/or nanopatterned disc 7 can be used as a storage disc for hard disk drives since the opposing individual patterns/recesses/elevations face one another in a precisely aligned manner. Consequently, the read head of a hard disk drive hardly has to be guided or, ideally, does not have to be guided at all and correspondingly greater rotational speeds for the hard disk drive may be used and the reading rate and the access times of the hard disk drive are improved. The individual patterns/recesses/elevations of the disc 7 achieve, according to the invention, overlapping of the opposing, aligned patterns of at least 30%, preferably, however, more than 70%, the pattern deviation being less than 20 μm, preferably less than 5 μm.

As an alternative to or in addition to optical positioning/adjustment, positioning/adjustment may also be carried out mechanically with respect to the outer diameter of the disc 7, since this achieves approximately the same accuracy in terms of positioning, and said positioning is carried out more rapidly.

The detection unit 6 can alternatively be constructed as a mechanical actuator with an integrated position measuring system. In this case, the at least three actuators can move symmetrically towards one another (as a chuck) and mechanically centre the disc 7 at the periphery thereof.

The invention claimed is:

1. A method for producing a nanopattern on an upper side and a lower side of a disc the method comprising the following steps:
    a) placing the disc on a receiving unit of a device for producing a nanopatterned disc,
    b) precisely aligning the disc relative to a lower die by means of a separate disc positioning unit in the x-direction, a separate disc positioning unit in the y-direction and a separate disc positioning unit in the z-direction and precisely aligning an upper die relative to the disc or the lower die by means of a separate die positioning unit in the x-direction, a separate die positioning unit in the y-direction and a separate die positioning unit in the z-direction, and
    c) moving the lower die into contact with the lower side of the disc and the upper die into contact with the upper side of the disc to transfer a defined nanopattern of the nanopatterned lower die onto the lower side of the disc and a defined nanopattern of the nanopatterned upper die onto the upper side of the disc.

2. A method according to claim 1, wherein the disc is aligned between two opposingly aligned nanopatterned dies.

3. A method according to claim 1, wherein the alignment of the disc with the dies is controlled by a central control unit, which controls the separate disc positioning units and the separate die positioning units, by means of detection means detecting the relative positions of the disc and the two dies.

4. A method according to claim 1, wherein the nanopatterned upper die and nanopatterned lower die are polydimethylsiloxane (PDMS) dies.

5. A method according to claim 2, wherein the upper and lower dies are aligned parallel to each other and to the disc.

6. A device for producing a nanopattern on an upper side and a lower side of a disc, the device comprised of:

a nanopatterned upper die for transferring a defined nanopattern of the nanopatterned upper die onto the upper side of the disc;

a nanopatterned lower die for transferring a defined nanopattern of the nanopatterned lower die onto the lower side of the disc;

a separate disc positioning unit in the x-direction, a separate disc positioning unit in the y-direction and a separate disc positioning unit in the z-direction, said separate disc positioning units for precisely positioning the disc relative to the lower die associated with the lower side of the disc; and a separate die positioning unit in the x-direction, a separate die positioning unit in the y-direction and a separate die positioning unit in the z-direction, said separate die positioning units for precisely positioning the upper die associated with the upper side of the disc relative to the lower die aligned with the disc.

* * * * *